United States Patent [19]
Narita

[11] Patent Number: 5,828,107
[45] Date of Patent: Oct. 27, 1998

[54] SEMICONDUCTOR INTEGRATED CIRCUIT DEVICE

[75] Inventor: Kaoru Narita, Tokyo, Japan

[73] Assignee: NEC Corporation, Tokyo, Japan

[21] Appl. No.: 748,495

[22] Filed: Nov. 8, 1996

[30] Foreign Application Priority Data

Nov. 15, 1995 [JP] Japan ................................ 7-296550

[51] Int. Cl.[6] .................................................. H01L 23/60
[52] U.S. Cl. ......................... 257/363; 257/358; 257/362
[58] Field of Search ................................... 257/358, 362, 257/363

[56] References Cited

U.S. PATENT DOCUMENTS

| 4,720,737 | 1/1988 | Shirato | 257/363 |
| 5,442,217 | 8/1995 | Mimoto | 257/362 |
| 5,616,943 | 4/1997 | Nguyen et al. | 257/363 |
| 5,641,981 | 6/1997 | Isono et al. | 257/362 |

OTHER PUBLICATIONS

Kaoru, Narita et al, "A Novel On–Chip Electrostatic Discharge (ESD) Protection for Beyond 500MHz DRAM", 1995, IEEE, pp. 539–542.

Primary Examiner—Gene M. Munson
Attorney, Agent, or Firm—Sughrue, Mion, Zinn, Macpeak & Seas, PLLC

[57] ABSTRACT

When an element of an internal circuit is arranged in the vicinity of an input/output terminal of an LSI chip, electrostatic break down is caused in an internal circuit element by discharge current generated between an input/output terminal and a grounding terminal or a power source terminal. Therefore, the elements are arranged with a distance to cause dead space therebetween to make down-sizing of the LSI chip difficult. Therefore, a resistor is disposed between an input/output terminal and a protection element connected thereto. The resistor causes increasing of resistance of a current path from the input/output terminal to the grounding terminal, at the common wiring. Thus influence of the electrostatic break down for the element of the internal circuit can be restricted to permit location of the resistor to permit the internal circuit element to be arranged in the vicinity of the protection element of the input/output terminal. Thus, a problem of the dead space can be solved and down-sizing of the LSI is enabled.

10 Claims, 6 Drawing Sheets 5,828,107

SEMICONDUCTOR INTEGRATED CIRCUIT DEVICE

BACKGROUND OF THE INVENTION

1. Field of the Invention

The present invention relates generally to a semiconductor integrated circuit device. More specifically, the invention relates to a semiconductor integrated circuit device with improved electrostatic break down voltage.

2. Description of the Related Art

In semiconductor integrated circuit device (hereinafter referred to as LSI), electrostatic break down voltage associating with increasing of package density becomes a problem, and various measure for protection has been taken. In general, a construction in which a diode for grounding an excessive voltage to a substrate is connected in parallel to an input/output circuit arranged between input/output terminals and an internal circuit, is employed. On the other hand, there has been proposed a construction, in which a current limiting resistor is connected in series to the input/output circuit.

However, insertion of a electrostatic break down protection circuit constituted of the diode or resistor in such input/output circuit is not desirable for influence to input/output signals. In this point, it is considered a construction to externally connect the electrostatic break down protection circuit to the input/output circuit.

FIGS. 4 to 6 are example of the electrostatic break down protection circuit externally connected to such input/output circuit, in which FIG. 4 is a plan view, FIG. 5 is a circuit diagram of FIG. 4 and FIG. 6 is a section taken along line 6—6 of FIG. 4.

In these drawings, to an internal circuit 420 formed in a P-type semiconductor substrate 100 forming an LSI chip, an input terminal 102 and a GND (ground) terminal 103 are connected. For respective of the input terminal 102 and the GND terminal 103, an electrostatic break down protection circuit connected to a common wiring 101 is connected.

Namely, to the input terminal 102, a first protection element 105 having an NPN bipolar transistor structure with a collector 112 and an emitter 113 of N-type diffusion layer in P-type semiconductor substrate 100, is connected. The input terminal 102 is connected to the common wiring 101 via the first protection element 105. Similarly, to the GND terminal 103, a second protection element 106 having a collector 115 and an emitter 114 is connected. The GND terminal 103 is connected to the common wiring 101 via the second protection element 106.

To the GND wiring 104 connected to the GND terminal 103, one of N-type MOSFET 111 among N-type MOSFETs forming the internal circuit 420 located in the vicinity of the first protection element 105 is arranged.

In such electrostatic break down protection circuit, with taking the GND terminal 103 as reference, if a negative electrostatic pulse is applied to the input terminal 102, a discharge passage is established as path Q of FIG. 5.

Namely, by applying an excessive voltage between terminals, the first protection element 105 and the second protection element 106 are operated at low resistance, and an electric charge is discharged from the GND terminal 103 of FIG. 5 via the second protection element 106, the common wiring 101, the first protection element 105 and the input terminal 102 to protect the internal circuit 420.

However, in such conventional protection circuit, minority carrier injected into the semiconductor substrate 100 by the foregoing operation of the protection element, namely electron, may damage the transistor in the vicinity of the protection element.

For example, explaining with reference to FIG. 6, when a negative electrostatic pulse is applied to the input terminal 102 with reference to the GND terminal 103, the first protection circuit 105 constructed with the NPN bipolar transistor operates. Then, according to principle of operation of the bipolar transistor, the electron is injected from an N-type diffusion layer 112 connected to the input terminal 102 to the substrate 100. A part of the injected electron reaches the N-type MOSFET 111 as the element to be protected and located at a distance D to be a hot electron by obtaining energy for high electrical field generated in depletion layer of junction of N-type diffusion layer 431 as source connected to the GND terminal 103. The hot electron is injected into the gate oxide layer of the MOSFET 111 to cause variation of characteristics, and to cause break down of the gate oxide layer in the worst case.

The electron injected into the semiconductor substrate 100 from the N-type diffusion layer 112 is reduced in exponential function manner according to a distance by recombination with hole in the semiconductor substrate 100. Namely, a density n of electron at a position distanced in D $\mu$m is substantially proportional to $\exp(-D/L)$. Here, L is a diffusion length of the electron in the P-type semiconductor substrate, and can be varied significantly depending upon fabricating condition, but in the range of approximately 100 to 500 $\mu$m.

Therefore, in the prior art, tolerance of break down is improved by setting the distance D large in the extend greater than or equal to 100 $\mu$m. However, this creates a dead space where the transistor of the internal circuit cannot be arranged, in the vicinity of the protection element. Such condition is similar with respect to the protection element of each terminal. The dead space presenting in each terminal is one of the cause preventing down-sizing of the chip.

SUMMARY OF THE INVENTION

It is an object of the present invention to provide an LSI which can reduce a dead space, arrange protection element and element to be protected in the vicinity of each other without lowering of the electrostatic break down voltage and thus realize down-sizing of the LSI chip.

According to the first aspect of the invention, a semiconductor integrated circuit device comprises:

an internal circuit formed on a semiconductor substrate;

an signal terminal for supplying an input/output signal of the internal circuit;

a power source supply terminal for supplying a power source for the internal circuit;

a common wiring;

a first protection element provided between the signal terminal and the common wiring for providing prevention of electrostatic break down;

a second protection element provided between the power supply terminal and the common wiring for providing prevention of electrostatic break down; and a resistor element to be inserted in one of between the signal terminal and the first protection element and between the power supply terminal and the second protection element.

The power source supply terminal to be a reference terminal, may be a grounding terminal. The power source supply terminals may be a positive or negative voltage power source terminal for supplying an operation power.

The first protection element may be a bipolar element having a pair of first and second diffusion layers of opposite conductive type relative to the semiconductor substrate, said first and second diffusion layers are arranged in spaced apart opposition, the first diffusion layer may be connected to the signal terminal, and the second diffusion is connected to a common wiring layer. Preferably, the second protection element may be a bipolar element with a pair of third and fourth diffusion layers of the opposite conductive type, the third diffusion layer may be connected to the power source supply terminal, and the fourth diffusion layer may be connected respectively to the common wiring.

In practice, the resistor element may be a tungsten silicide layer. A resistance of a current passage formed between the signal terminal and the power source supply terminal may be lower than or equal to 15Ω. A distance d' between the circuit element of the internal circuit and the signal terminal may satisfy $$\alpha \cdot exp(-D/L) = (R1/R) \alpha \cdot exp(-D'/L)$$

wherein $\alpha$ is a predetermined coefficient, L is a diffusion length of electron of semiconductor substrate, R1 is a resistance of the resistor element, R is a resistance value of the current passage and d is a distance not to cause break down of the circuit element upon no break down of the circuit element may be caused.

According to another aspect of the invention, a semiconductor integrated circuit device comprises:

an internal circuit formed on a semiconductor substrate;

an signal terminal for supplying an input/output signal of the internal circuit;

first and second power source supply terminals for supply power source for the internal circuit;

a common wiring;

a first protection element provided between the signal terminal and the common wiring for providing prevention of electrostatic break down;

a second protection element provided between the first power supply terminal and the common wiring for providing prevention of electrostatic break down;

a third protection element provided between the second power source supply terminal and the common wiring for providing prevention of electrostatic break down; and a resistor element inserted between the signal terminal and the first protection element.

Both of the first and second power source supply terminals may be grounding terminals.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The present invention will be discussed hereinafter in detail in terms of the preferred embodiments with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
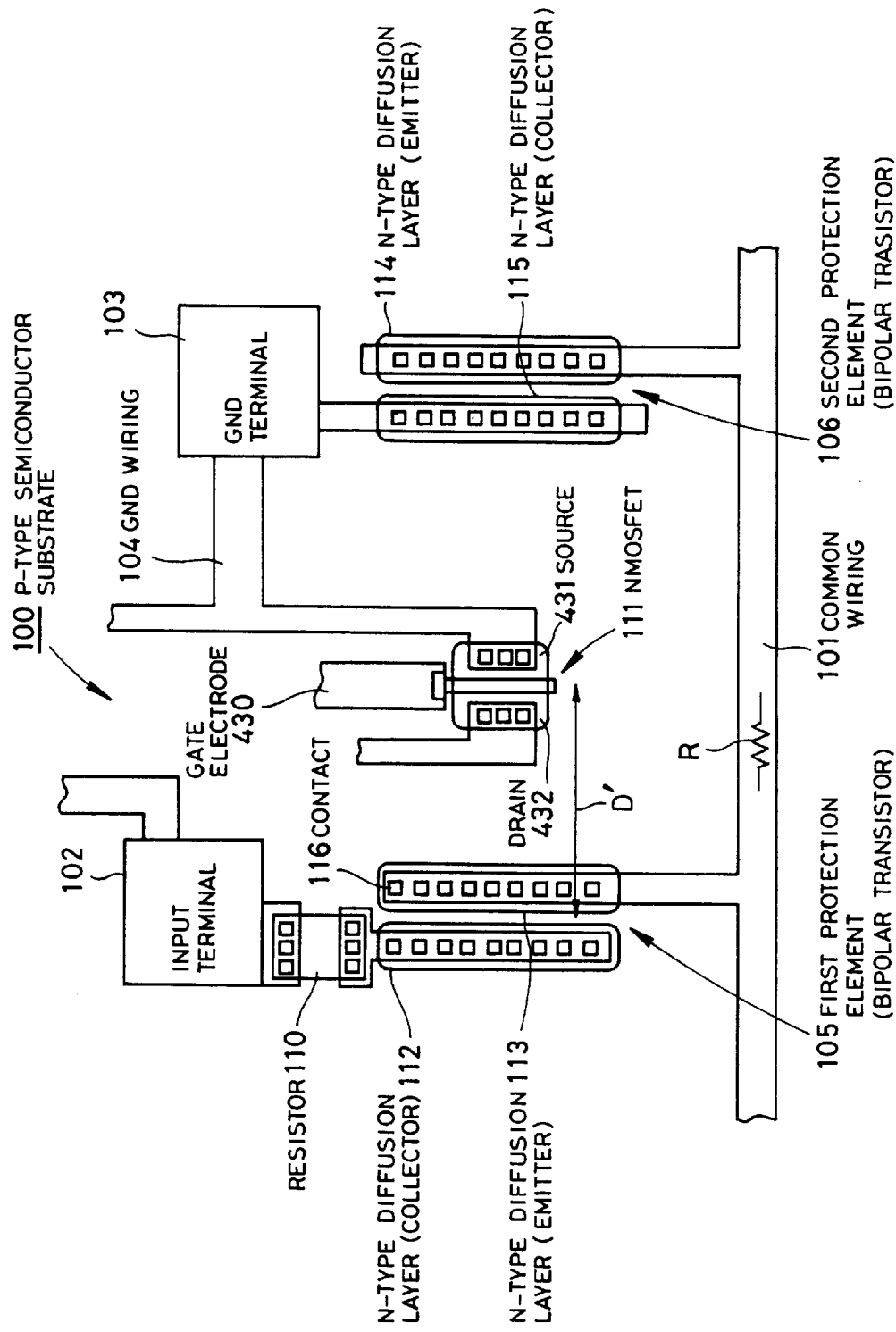
FIG. 1 is a diagrammatic illustration showing a planar layout of the first embodiment of a semiconductor integrated circuit device according to the present invention.
Figure 4:
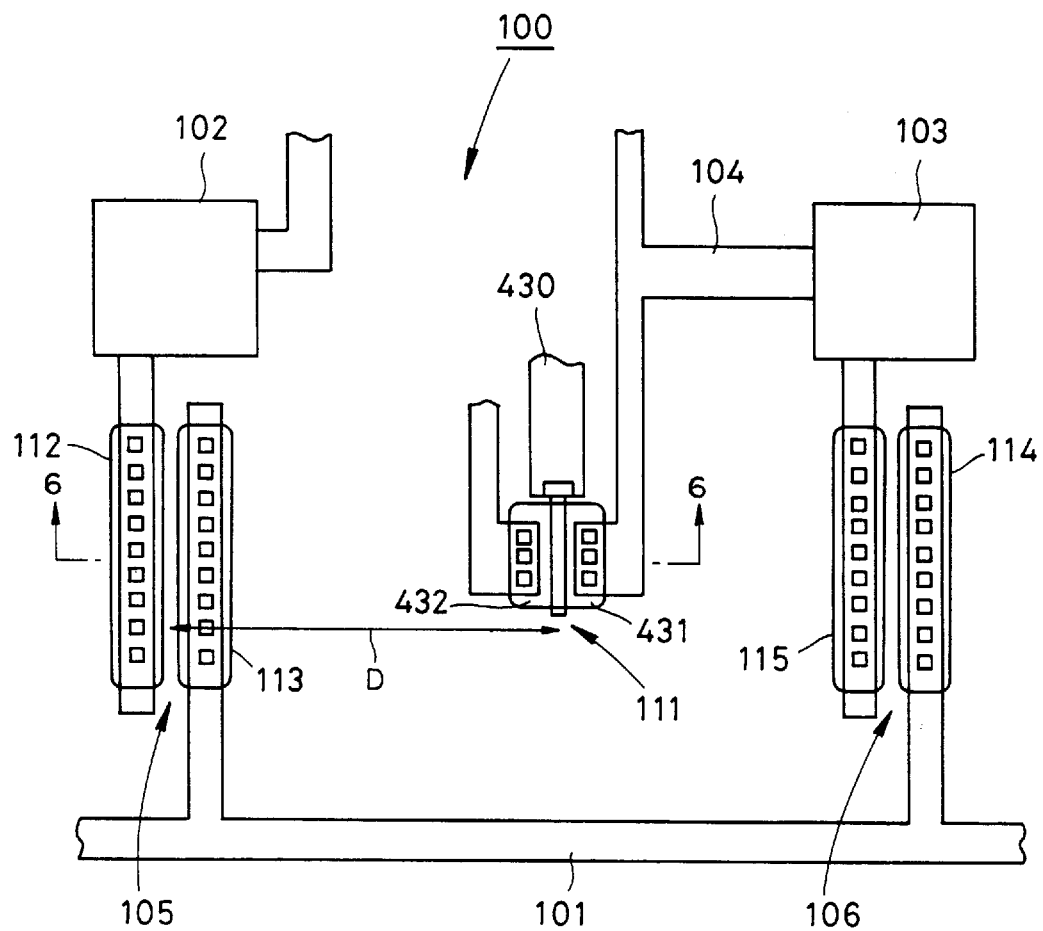
FIG. 4 is a diagrammatic illustration showing a planar layout of one example of conventional semiconductor integrated circuit device.
Figure 5:
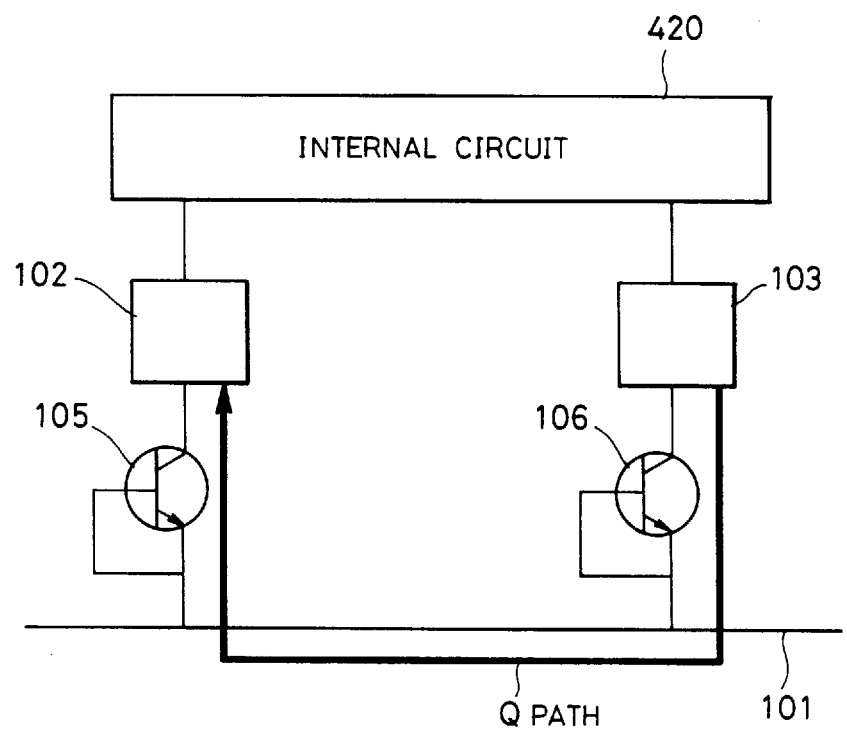
FIG. 5 is a circuit diagram of FIG. 4.
Figure 6:
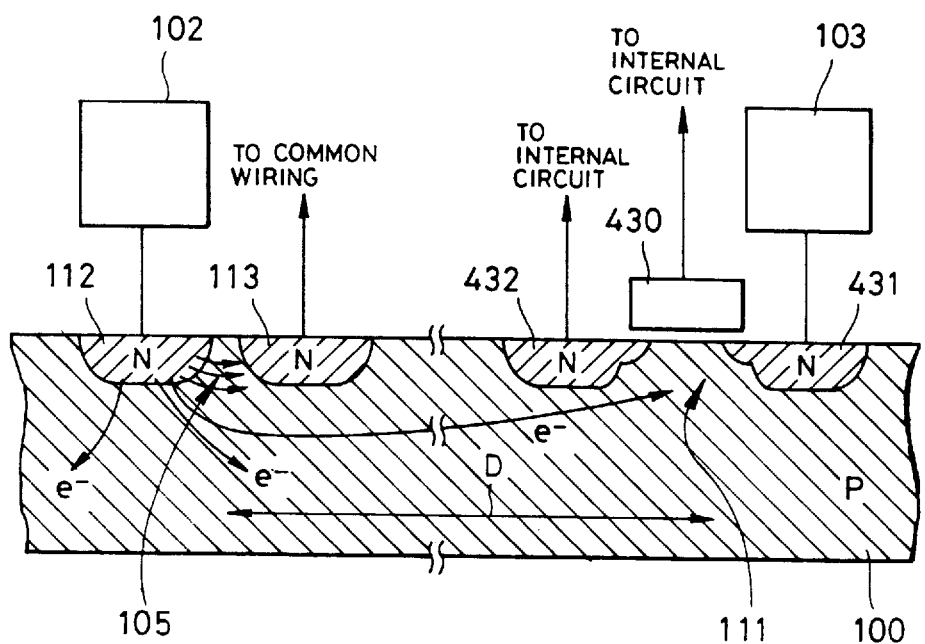
FIG. 6 is a diagrammatic section taken along line 6—6 of FIG. 4.

FIG. 1 is a diagrammatic illustration showing a layout of the first embodiment of a semiconductor integrated circuit device according to the present invention. Like elements to those in FIG. 4 will be identified by same reference numerals. On the P-type semiconductor substrate 100, a not shown internal circuit is formed. As one of elements of the internal circuit, the N-type MOSFET 111 having the N-type diffusion layer and the gate electrode is illustrated.

On the other hand, to the internal circuit, the input terminal 102 and the GND terminal 103 are connected respectively. To the GND wiring 104 connected to the GND terminal 103, one (431) of N-type diffusion layers 431 and 432 of the N-type MOSFET 111 is connected. Then, the input terminal 102 is connected to the first protection element 105 via a resistor 110. The GND terminal 103 is directly connected to the second protection element 115. The input terminal 102 and the GND terminal 103 are connected to a common wiring 101 via the first and second protection elements 105 and 106.

Respective of the first and second protection elements 105 and 106 are constructed as NPN bipolar transistors constructed with collector diffusion layers 112 and 115 and emitter diffusion layers 113 and 114. In the first protection element 105, the collector diffusion layer 112 is connected to the input terminal 102 via the resistor 110, and the emitter diffusion layer 113 is connected to the common wiring 101.

On the other hand, in the second protection element 106, the collector diffusion layer 115 is directly connected to the GND terminal 103 and the emitter diffusion layer 114 is connected to the common wiring 101. It should be noted that the resistor 110 is a resistor of 5Ω formed of a tungsten silicide wiring layer.

With the construction set forth above, when the first and second protection elements 105 and 106 are active in response to application of a negative electrostatic pulse to the input terminal 102 with taking the GND terminal 103 as reference, a discharge current flows through a path of the GND terminal 103, the second protection element 106, the common wiring 101, the first protection element 105, the resistor 110 and the input terminal to protect the internal circuit.

Here, resistance value of respective protection elements 105 and 106 in conductive state are 2Ω, parasitic resistance value R of the common wiring 101 between the first and second protection elements 105 and 106 is 1Ω. When other wiring resistance can be ignored, a resistance of the discharge path from the input terminal 102 to the GND terminal 103 becomes 10Ω. Accordingly, when the resistor 110 is not present, the resistance becomes 5 Ω.

Since a peak value of the discharge current is inversely proportional to a resistance value of the discharge path, when the resistor 110 is present, the current is restricted to be one half of the case where the resistor 110 is not present. Therefore, at this time, the amount of electron injected from the N-type diffusion layer 112 of the first protection element 105 becomes substantially one half.

A condition, in which the density of electron at a position distanced at a distance D from the first protection element 105 as the resistor 110 being not present becomes equal to the density of the electron at a distance D' as the resistor 110 being present is expressed by:

$$\alpha \cdot exp(-D/L) = (½)\alpha \cdot exp(-D'/L)$$

Thus, when D=100 μm, L=100 μm, value of approximately 30 μm is obtained as D'.

Namely, when the resistor 110 is not present, if break down is not caused at D=100 μm, break down may not be caused at D'=30 μm when the resistor 110 is present.

Furthermore, when the resistance value is increased to 10Ω, the discharge current becomes one third in comparison with the case where the resistor 110 is not provided. At this time, similarly, a value of D' satisfying $$\alpha \cdot exp(-D/L) = (⅓)\alpha \cdot exp(-D/L)$$

$$D=100 \mu m, L=100 \mu m$$

becomes negative value.

Namely, if break down is not caused at D=100 μm when the resistance 110 is not present, break down will never be caused even at zero of the distance D' when 10Ω is added as resistor 110.

In practice, when the value of the resistor 110 is excessively large, the voltage between the terminal is elevated upon electrostatic discharge to cause degradation of protecting ability of the internal circuit. Therefore, it is preferred to set the resistance value of the resistor 110 so that the total resistance of the discharge passage becomes less than or equal to 15Ω as in the shown embodiment. In this case, when the peak value of the discharge current is 1A, a maximum voltage between the terminals is 15V. Since this voltage is lower than a withstanding voltage of 10 nm of silicon oxide layer, good protection of the internal circuit can be maintained.

Accordingly, in the shown embodiment, it becomes unnecessary to maintain unnecessarily large space between the first protection element 105 and the element 111 of the internal circuit, which space otherwise becomes the dead space to prevent increasing of package density of the LSI. Therefore, higher package density of the LSI or down-sizing of the chip can be achieved in the extend corresponding to the eliminated space.

Figure 2:
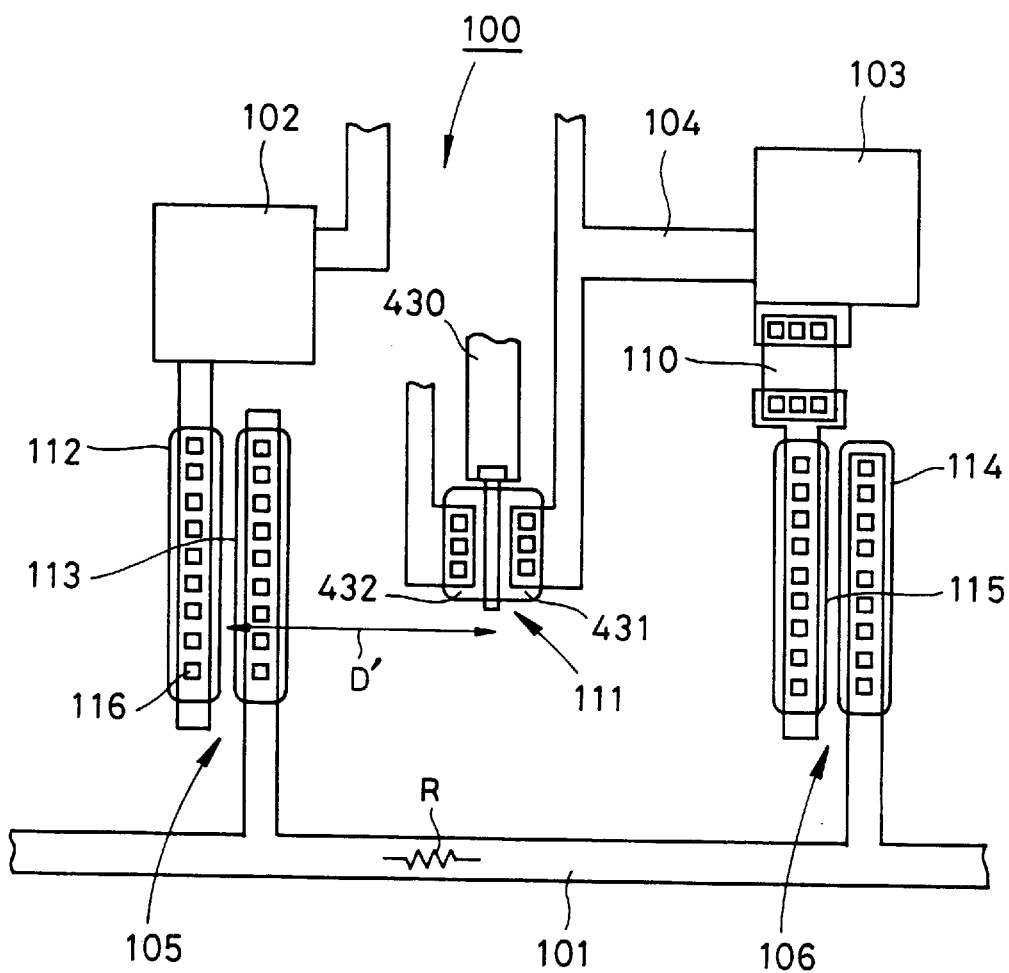
FIG. 2 is a diagrammatic illustration showing a planar layout of the second embodiment of a semiconductor integrated circuit device according to the present invention.

FIG. 2 shows the second embodiment of the semiconductor integrated circuit device according to the present invention. In FIG. 2, like elements to those in FIG. 1 are identified by same reference numerals. In the shown embodiment, the resistor 110 is disposed between the GND terminal 103 and the collector diffusion layer 115 of the second protection element 106. On the other hand, no resistor is inserted between the input terminal 102 and the first protection element 105.

Even when the resistor 110 is connected at the side of the GND terminal 103 as set forth above, the discharge current can be limited as set out in the first embodiment, and it is possible to permit distance between the first protection element 105 and the N-type MOSFET 111 of the internal circuit.

Figure 3:
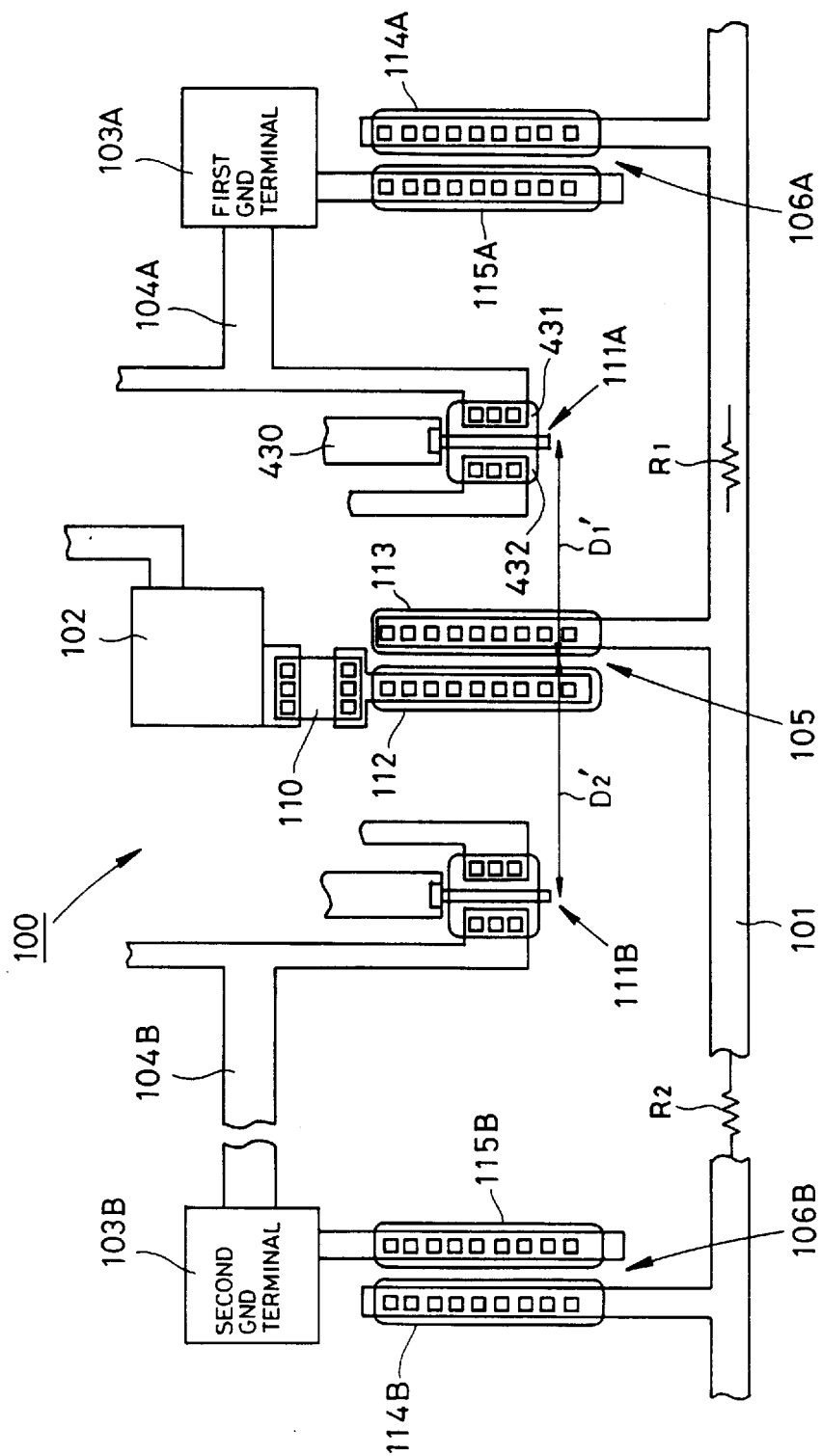
FIG. 3 is a diagrammatic illustration showing a planar layout of the third embodiment of a semiconductor integrated circuit device according to the present invention.

FIG. 3 shows the third embodiment of the semiconductor integrated circuit device according to the present invention. In FIG. 3, like elements to those in FIGS. 1 and 2 are identified by same reference numerals. In the shown embodiment, the N-type MOSFETs 111A and 111B of the internal circuit are arranged at both sides of the input terminal 102 provided on the semiconductor substrate 100. Also, respective sources of these N-type MOSFETS 111A and 111B are respectively connected to first and second GND terminals 103A and 103B provided independently of each other via the GND wirings 104A and 104B.

The input terminal 102 is connected to the collector diffusion layer 112 of the first protection element 105 via the resistor 110, and the emitter diffusion layer 113 is connected to the common wiring 101.

On the other hand, to respective GND terminals 103A and 103B, respective collector diffusion layers 115A and 115B of the second protection element 106A and a third protection element 106B are connected directly. The emitter diffusion layers 114A and 114B of respective protection elements 106A and 106B are connected to a common wiring 101.

In the construction set forth above, assuming that the resistance of the resistor 110 is 0Ω, and when the conduction resistances of respective protection elements 105A, 106A and 106B are 2Ω, a parasitic resistance value R1 of the common wiring 101 from the first protection element 105 to the second protection element 106A is 1Ω, and a parasitic resistance R2 of the common wiring from the first protection element 105 to the third protection element 106B is 6Ω, the resistance value of the discharge passage upon application of the negative electrostatic pulse to the input terminal 102 with taking the first GND terminal 103A as reference, is 5Ω, and the resistance value of the discharge passage upon application of the negative electrostatic pulse on the input terminal 102 with taking the second GND terminal 103B as reference, becomes 10 Ω.

In the case where the first GND terminal 103A is taken as reference, and a minimum distance D1 not to cause break down is assumed to be 50 μm, D2 satisfying $$\alpha \cdot exp(-D1/L) = (½)\alpha \cdot exp(-D2/L)$$

$$D1=50 \mu m, L=100 \mu m$$

becomes negative. Therefore, the break down will never be caused even at zero of D2.

Namely, when the resistor 110 is not present, a distance to the element of the internal circuit from the first protection element 105, at which the break down is not caused, is differentiated depending upon which of the first GND terminal 103A and the second GND terminal 103B is to be taken as reference terminal. Conversely, this means that when the distance from the protection element to the internal circuit is designed with a constant reference, the withstanding voltage can be differentiated depending upon the GND terminal selected as the reference terminal.

However, in the semiconductor integrated circuit device according to the present invention, the resistor 110 is set at a resistance value greater than 0Ω, for example at 5Ω or so forth. In such case, the resistance of the discharge passage becomes 10Ω if the first GND terminal 103A is selected as the reference terminal, and 15Ω if the second GND terminal is selected as reference terminal. Then, D1' and D2' satisfying $$\alpha \cdot exp(-D1/L) = (\tfrac{1}{2})\alpha \cdot exp(-D1'/L)$$

$$\alpha \cdot exp(-D2/L) = (\tfrac{1}{2})\alpha \cdot exp(-D2'/L)$$

$$D1 = 50 \ \mu m, \ L = 100 \ \mu m,$$

become negative value. In either case, break down will never be caused in either case. As a consequence, by providing the resistor 110, difference of the withstanding voltage and/or fluctuation due to difference of the reference terminal cab be restricted.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

For instance, while the foregoing embodiments are exemplified in terms of between the input terminal and the GND terminal, the same idea is applicable even between the output terminal and the GND terminal. Also, the present invention is applicable even between the input terminal or output terminal and a power source terminal.

As set forth above, the present invention can prevent the electrostatic break down voltage of internal circuit element from lowering due to discharge current which can be generated via the common wiring, by connecting resistance between the ground or power source terminal and the protection element or between the input/output terminal and the protection element. Therefore, a distance between the internal circuit element and the protection element can be reduced to require substantially no dead space to be provided so as to permit realization of higher package density or down-sizing of the chip in the LSI. Also, when a plurality of grounding terminals or the power source terminals are present, fluctuation of the withstanding voltage depending upon the terminals to be reference terminal for application of the electrostatic pulse, can be suppressed.

What is claimed is:

1. A semiconductor integrated circuit device comprising:
   an internal circuit formed on a semiconductor substrate;
   an signal terminal for supplying an input/output signal of said internal circuit;
   a power source supply terminal for supplying a power source for said internal circuit;
   a common wiring;
   a first protection element provided between said signal terminal and said common wiring for providing prevention of electrostatic break down;
   a second protection element provided between said power supply terminal and said common wiring for providing prevention of electrostatic break down; and
   a resistor element to be inserted in one of between the signal terminal and the first protection element and between said power supply terminal and said second protection element.

2. A semiconductor integrated circuit device as set forth in claim 1, wherein said power source supply terminal to be a reference terminal, is a grounding terminal.

3. A semiconductor integrated circuit device as set forth in claim 1 wherein said power source supply terminal is a positive or negative voltage power source terminal for supplying an operation power.

4. A semiconductor integrated circuit device as set forth in claim 1, wherein said first protection element is a bipolar element having a pair of first and second diffusion layers of opposite conductive type relative to the semiconductor substrate, said first and second diffusion layers are arranged in spaced apart opposition, the first diffusion layer is connected to said signal terminal, and said second diffusion is connected to a common wiring layer.

5. A semiconductor integrated circuit device as set forth in claim 1, wherein said second protection element is a bipolar element having a pair of third and fourth diffusion layers of opposite conductive type relative to the semiconduction substrate, said third and fourth diffusion layers are arranged in spaced apart opposition, said third diffusion layer is connected to said power source supply terminal, and said fourth diffusion layer is connected respectively to said common wiring.

6. A semiconductor integrated circuit device as set forth in claim 1, wherein said resistor element is a tungsten silicide layer.

7. A semiconductor integrated circuit device as set forth in claim 1, wherein a resistance of a current passage formed between said signal terminal and the power source supply terminal is lower than or equal to 15 Ω.

8. A semiconductor integrated circuit as set forth in claim 7, wherein a distance D' between the circuit element of said internal circuit and said signal terminal satisfies $$\alpha \cdot exp(-D/L) = (R1/R)\alpha \cdot exp(-D'/L)$$

wherein α is a predetermined coefficient, L is a diffusion length of electron of semiconductor substrate, R1 is a resistance of said resistor element, R is a resistance value of said current passage and D is a distance not to cause break down of said circuit element upon no break down of the circuit element may be caused.

9. A semiconductor integrated circuit device comprising:
   an internal circuit formed on a semiconductor substrate;
   an signal terminal for supplying an input/output signal of said internal circuit;
   first and second power source supply terminals for supply power source for said internal circuit;
   a common wiring;
   a first protection element provided between said signal terminal and said common wiring for providing prevention of electrostatic break down;
   a second protection element provided between said first power supply terminal and said common wiring for providing prevention of electrostatic break down;
   a third protection element provided between said second power source supply terminal and said common wiring for providing prevention of electrostatic break down; and
   a resistor element inserted between the signal terminal and the first protection element.

10. A semiconductor integrated circuit device as set forth in claim 9, wherein both of said first and second power source supply terminals are grounding terminals.

* * * * *